United States Patent
Gerardiere et al.

(10) Patent No.: US 10,847,998 B2
(45) Date of Patent: Nov. 24, 2020

(54) REMOTE POWER SUPPLY, POSITION SENSOR AND WIRELESS COMMUNICATION DEVICE FOR A DOOR WITH AN EXTENDABLE HANDLE OF A MOTOR VEHICLE

(71) Applicants: Continental Automotive France, Toulouse (FR); Continental Automotive GmbH, Hannover (DE)

(72) Inventors: Olivier Gerardiere, Tournefeuille (FR); Gabriel Spick, Toulouse (FR); Yannis Escalante, Toulouse (FR)

(73) Assignees: Continental Automotive France (FR); Continental Automotive GmbH (DE)

( * ) Notice: Subject to any disclaimer, the term of this patent is extended or adjusted under 35 U.S.C. 154(b) by 0 days.

(21) Appl. No.: 16/480,370

(22) PCT Filed: Jun. 7, 2018

(86) PCT No.: PCT/FR2018/051315
§ 371 (c)(1),
(2) Date: Jul. 24, 2019

(87) PCT Pub. No.: WO2018/229394
PCT Pub. Date: Dec. 20, 2018

(65) Prior Publication Data
US 2019/0386514 A1    Dec. 19, 2019

(30) Foreign Application Priority Data

Jun. 13, 2017 (FR) .................................. 17 55293

(51) Int. Cl.
*H02J 50/10* (2016.01)
*E05B 81/76* (2014.01)
(Continued)

(52) U.S. Cl.
CPC .............. *H02J 50/10* (2016.02); *E05B 81/77* (2013.01); *E05B 81/78* (2013.01); *E05B 81/80* (2013.01);
(Continued)

(58) Field of Classification Search
CPC .......... H02J 50/10; E05B 81/77; E05B 81/78; E05B 81/80; E05B 85/107; H03K 17/955
See application file for complete search history.

(56) References Cited

U.S. PATENT DOCUMENTS 6,961,005 B2    11/2005    Clement et al.
2002/0021226 A1    2/2002    Clement et al.
(Continued)

FOREIGN PATENT DOCUMENTS

DE    102015119096 A1    5/2017
EP    1179827 A1    2/2002
(Continued)

OTHER PUBLICATIONS

Non Final Office Action for U.S. Appl. No. 16/480,364, dated Feb. 21, 2020, 18 pages.
(Continued)

*Primary Examiner* — Nabil H Syed
(74) *Attorney, Agent, or Firm* — RatnerPrestia

(57) ABSTRACT

A device for a handle able to be deployed in relation to a motor vehicle door. The device includes a primary module integrated into the door, supplying power, through inductive coupling, to a secondary module integrated into the handle and that moves in relation to the primary module along a predetermined path when the door handle moves between a deployed position and a retracted position. An advantageous arrangement of two primary coils of the primary module and of a secondary coil of the secondary module allows the device to estimate the position of the door handle. Further- (Continued)

more, the device makes it possible to establish a wireless communication link between the primary module and the secondary module.

13 Claims, 5 Drawing Sheets

(51) Int. Cl.
    *E05B 81/78*     (2014.01)
    *E05B 81/80*     (2014.01)
    *E05B 85/10*     (2014.01)
    *H03K 17/955*     (2006.01)

(52) U.S. Cl.
    CPC ......... *E05B 85/107* (2013.01); *H03K 17/955* (2013.01); *E05Y 2900/50* (2013.01); *G07C 2209/65* (2013.01)

(56) References Cited

U.S. PATENT DOCUMENTS

| | | |
|---|---|---|
| 2011/0140479 A1 | 6/2011 | Okada et al. |
| 2015/0028864 A1 | 1/2015 | Wang et al. |
| 2015/0115728 A1* | 4/2015 | Yamamoto ............ H02J 5/005 307/104 |
| 2016/0043567 A1 | 2/2016 | Matsumoto et al. |
| 2016/0117875 A1 | 4/2016 | Duchemin |
| 2017/0076519 A1 | 3/2017 | Rabbat |
| 2019/0386514 A1 | 12/2019 | Gerardiere et al. |

FOREIGN PATENT DOCUMENTS

| | | |
|---|---|---|
| FR | 3067528 A1 | 12/2018 |
| FR | 3067529 A1 | 12/2018 |
| FR | 3071001 A1 | 3/2019 |
| WO | 2011062097 A1 | 5/2011 |

OTHER PUBLICATIONS

International Search Report and Written Opinion for International Application No. PCT/FR2018/051315, dated Aug. 14, 2018—8 pages.

Notice of Allowance for U.S. Appl. No. 16/480,364, dated Apr. 13, 2020, 12 pages.

* cited by examiner

REMOTE POWER SUPPLY, POSITION SENSOR AND WIRELESS COMMUNICATION DEVICE FOR A DOOR WITH AN EXTENDABLE HANDLE OF A MOTOR VEHICLE

CROSS REFERENCE TO RELATED APPLICATIONS

This application is the U.S. National Phase Application of PCT International Application No. PCT/FR2018/051315, filed Jun. 7, 2018, which claims priority to French Patent Application No. 1755293, filed Jun. 13, 2017, the contents of such applications being incorporated by reference herein.

FIELD OF THE INVENTION

The present invention belongs to the field of electromagnetic induction applied to energy transmission, position sensor and wireless communication functions. The invention relates in particular to a remote power supply, position measurement and wireless communication device for a deployable handle of a motor vehicle door.

BACKGROUND OF THE INVENTION

In a motor vehicle, it is known to use deployable handles for the doors. Such a handle is in the retracted position inside the door most of the time, that is to say that it is flush with the body of the door so as to be virtually invisible, and it is in the deployed position only when a user needs to open the door from outside the vehicle.

There are two main advantages to using a deployable handle. The first advantage is improved aerodynamic performance due to better streamlining of a vehicle when the handles of its doors are in the retracted position. The second advantage concerns esthetics.

A deployable door handle generally incorporates an electronic module, called "door handle module", comprising one or more sensors that make it possible for example to identify the need to deploy the handle, to lock or to unlock the door by detecting the approach of the hand or of a fob of a user.

This door handle module generally communicates information from sensors to a main electronic module, called "door module", contained in the door of the vehicle. The door module is for example responsible for supplying electric power to the door handle module, for communicating therewith, and for driving a motor that makes it possible to deploy the handle. The door module therefore generally incorporates a position sensor for controlling this motor.

It is known to connect a door handle module to a door module using electrical cables so as to supply electric power to the door handle module and possibly to allow information to be exchanged between the two modules in a wired manner.

Such electrical cabling between the door module and the door handle module however entails numerous drawbacks. Specifically, besides the cost and the bulk that they constitute in the door handle module, the electrical cables impose significant mechanical integration constraints, since they have to adapt to the movement of the door handle module without hampering it.

To dispense with electrical cables, it is known for example to use magnetic-induction wireless electric power supply devices. However, such devices are not generally suitable for the case where the element to be charged is able to move in relation to the charging element. It is also known to use inductive sensors to determine the position of a target in relation to the sensor. For example, LVDT (acronym for "linear variable differential transformer") sensors are based on the variation, on the basis of the position of an electrically conductive target, in the voltages induced in two secondary coils by the magnetic field generated by a primary coil. Lastly, there are numerous devices for wireless communication between two electronic modules, such as for example Bluetooth or NFC (acronym for "near-field communication") technology. The proliferation of these devices in an electronic door handle module however goes against the miniaturization thereof and reducing its complexity and its cost.

SUMMARY OF THE INVENTION

The aim of an aspect of the present invention is to rectify all or some of the drawbacks from the prior art, in particular those outlined above.

To this end, and according to a first aspect, the invention relates to an electric power supply device for a door handle able to be deployed in relation to a motor vehicle door, including a primary module integrated into the door and a secondary module integrated into the handle. The secondary module moves in relation to the primary module along a predetermined path when the door handle moves between a deployed position and a retracted position in relation to the door. The primary module is configured so as to form an electromagnetic field able to supply electric power to the secondary module through magnetic induction, and it includes at least two inductive coils, called "primary coils". The secondary module comprises an inductive coil, called "secondary coil". The primary coils and the secondary coil are configured such that:
  when the door handle moves from the deployed position to the retracted position, the secondary coil moves from a first primary coil to a second primary coil,
  the amplitude of the magnetic field flux generated by the first primary coil through the secondary coil is at a maximum when the handle is in the deployed position,
  the amplitude of the magnetic field flux generated by the second primary coil through the secondary coil is at a maximum when the handle is in the retracted position.

By way of such provisions, it is possible to use the primary coils and the secondary coil not only to transmit energy through inductive coupling, but also to estimate the position of the secondary module on the basis of values representative of the amplitude of the magnetic field flux generated by each primary coil through the secondary coil, or in other words, on the basis of values representative of the inductive coupling existing between each primary coil and the secondary coil. The amplitude of the magnetic field flux generated by a primary coil through the secondary coil specifically varies depending on the position of the secondary coil, depending on whether or not it is facing said primary coil.

The meaning of "amplitude of the magnetic field flux" is defined below. As a reminder, the flux of the magnetic field $\vec{B}$ through an infinitesimal element of oriented surface area $d\vec{S}$ is the scalar product of these two vectors. The flux of the magnetic field $\vec{B}$ through a surface area S is then the integral:

$$\phi = \iint_S \vec{B} \cdot d\vec{S}$$

Also, the magnetic field $\vec{B}$ in a coil whose turns are circular is oriented along the axis of the coil, and its amplitude is defined theoretically by:

$$B = \mu_0 \frac{N \cdot i}{l} \quad (1)$$

in which expression $\mu_0$ is the magnetic permeability of free space, N is the number of turns of the coil, l is the length of the coil, and i is the current flowing through the turns of the coil.

Ignoring the effects at the edges of the coil, that is to say considering the field B to be constant and defined by (1) at any point of a surface area S of a cross section of the coil, the magnetic field flux generated by the coil and passing through the surface area S is then:

$$\phi = B \cdot S = \mu_0 \frac{N \cdot i}{l} \cdot S \quad (2)$$

If the current i flowing through the coil varies, for example in the form of a sinusoidal AC current, then the same applies for the magnetic field flux passing through the surface area S. For the remainder of the description, "the amplitude of the magnetic field flux" is defined as being the maximum value that the flux of the magnetic field is able to take at a given instant. This corresponds to the envelope of the signal that represents the variation in the magnetic field flux over time. Thus, if the current i flowing through the coil is a sinusoidal AC current, it may be expressed in the form $i = A \cdot \sin(\omega \cdot t)$, in which expression $\omega$ corresponds to the angular frequency of said sinusoidal AC current, then the amplitude of the magnetic field flux may be expressed, with reference to expression (2) above, using the following expression:

$$\varphi = \mu_0 \frac{N \cdot A}{l} \cdot S \quad (3)$$

The magnetic field generated by a primary coil and passing through a secondary coil placed facing said primary coil will depend on several factors, such as for example the distance between the primary coil and the secondary coil or else the shape of the turns. However, with reference to formulae (2) and (3), it is understood that, for the device according to an aspect of the invention, the amplitude of the magnetic field flux generated by a primary coil through the secondary coil varies during the movement of the secondary coil depending on the surface area of said secondary coil facing the primary coil.

In addition, as the amplitude of the magnetic field flux generated by a primary coil through the secondary coil is at a maximum when the handle is in the deployed position or in the retracted position, this allows a remote supply of power to the secondary module by the primary module in these two specific positions.

In particular embodiments, aspects of the invention may furthermore include one or more of the following features, taken alone or in any technically feasible combination.

In particular embodiments, the primary module includes an electronic circuit, called "control circuit", configured so as to measure, for each primary coil, a parameter representative of the amplitude of the magnetic field flux generated by the primary coil under consideration through the secondary coil, and so as to estimate the position of the secondary module in relation to the primary module on the basis of said measurements.

In particular embodiments, the parameter representative of the amplitude of the magnetic field flux generated by a primary coil through the secondary coil is an amplitude of a strength of a load current flowing in said primary coil.

When the amplitude of the strength of the load current flowing in a primary coil increases gradually toward its maximum level, this means that the secondary coil is gradually moving so as to face said primary coil, the door handle gradually moving toward a deployed or retracted stop position.

In particular embodiments, the control circuit of the primary module is furthermore configured so as to control, on the basis of the estimated position of the secondary module, a motor that moves said secondary module in relation to the primary module.

In particular embodiments, the control circuit of the primary module is furthermore configured so as to modulate the amplitude of a voltage across the terminals of the primary coils on the basis of an item of information to be transmitted to the secondary module.

In particular embodiments, the secondary module furthermore includes an electronic circuit, called "transmission circuit", configured so as to modulate the amplitude of a voltage across the terminals of the secondary coil on the basis of an item of information to be transmitted to the primary module.

In particular embodiments, the secondary module includes an electronic circuit, called "remote power supply circuit", configured so as to recover the electrical energy transmitted through magnetic induction between at least one of the primary coils and the secondary coil so as to supply the secondary module with a DC-voltage electric power supply when the handle is in the retracted or deployed position.

In particular embodiments, the path followed by the secondary module corresponds to a translational movement of said secondary module in relation to the primary module.

According to a second aspect, the invention relates to a motor vehicle door with a deployable handle. The door includes an electric power supply device according to any one of the above embodiments.

According to a third aspect, the invention relates to a motor vehicle including a door with a deployable handle according to any one of the embodiments of the invention.

BRIEF DESCRIPTION OF THE DRAWINGS

Aspects of the invention will be better understood upon reading the following description, given by way of completely nonlimiting example and with reference to the following figures, in which.

In these figures, identical references from one figure to another denote identical or analogous elements. For the sake of clarity, the elements that are shown are not to scale, unless stated otherwise.

DETAILED DESCRIPTION OF THE PREFERRED EMBODIMENTS

As indicated above, the present an aspect of relates to a remote power supply device for a door, with a deployable handle, of a motor vehicle. It should be noted that the term "door" may refer here equally to a side door, a trunk door, or else any other type of opening element of the vehicle.

In this device, a secondary module, integrated into the door handle, is able to move in relation to a primary module that is itself integrated into the door. The primary module is responsible for the remote supply of power to the secondary module. "Remotely supplying power" or "remote power supply" is understood to mean the wireless transmission of electrical energy from the primary module to the secondary module through electromagnetic coupling.

The device may furthermore be used to perform other functions, such as for example estimating the position of the secondary module, or else for wireless communication between the two modules. The door module is thus for example responsible for supplying electrical energy to the door handle module, for communicating therewith, and for driving a motor that makes it possible to deploy the handle.

Figure 1:
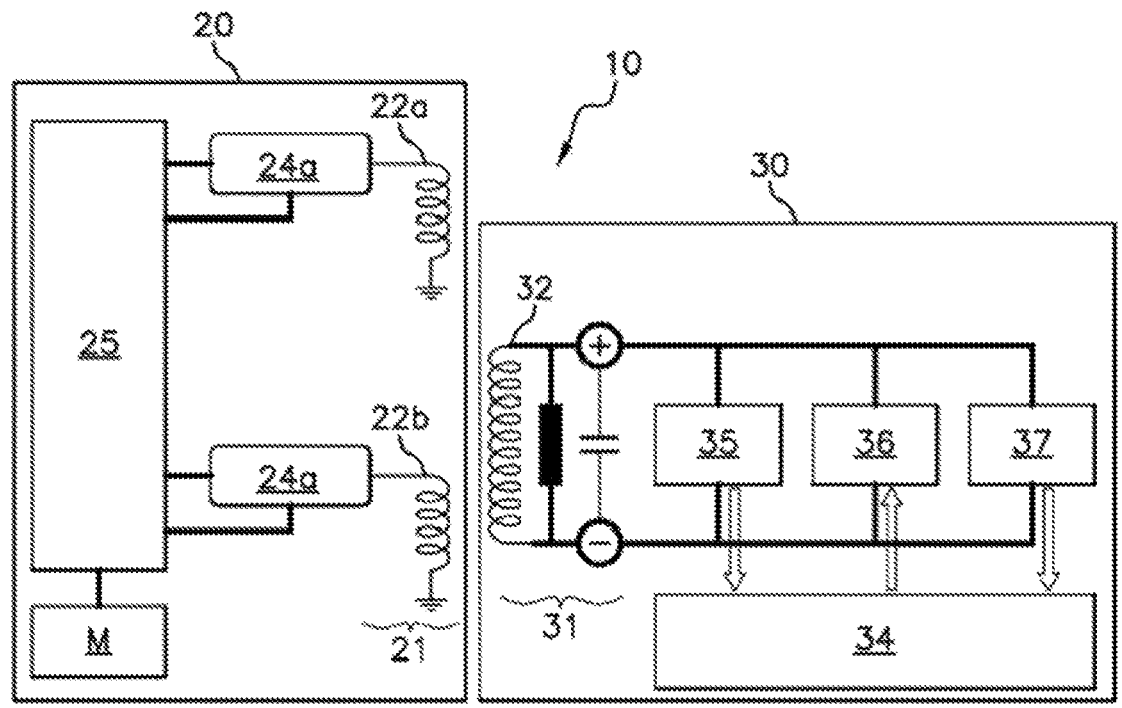
FIG. 1 shows a schematic depiction of a primary module and of a secondary module for a device according to an aspect of the invention.

FIG. 1 schematically shows one embodiment of such a device 10. It comprises a primary module 20 that corresponds to the door module and a secondary module 30 that corresponds to the door handle module.

The primary module 20 comprises, in the example shown, several electronic circuits. One of these electronic circuits, called "primary circuit" 21, comprises two primary coils 22a and 22b. The primary circuit is for example supplied with electric power by an AC voltage supplied by the primary module 20, which may itself be supplied with power by the electrical network of the vehicle. An AC current therefore flows in each primary coil 22a and 22b. The amplitude of the strength of the electric current in each primary coil varies depending on the stronger or weaker magnetic coupling existing between the primary coil under consideration and a secondary coil 32 belonging to the secondary module 30 and placed facing all or some of said primary coils. It should be noted that this variation in the amplitude of the strength of the electric current flowing in each primary coil is observed because the primary circuit is supplied by a voltage generator, and each primary coil is therefore attacked with a voltage. It would also be possible to take the scenario of attacking the primary coils with a current, by supplying the primary circuit with a current generator. In this case, it is a variation in the amplitude of the voltage across the terminals of each primary coil that would be observed. Each primary coil 22a and 22b is for example respectively associated with an electronic impedance-matching and decoupling circuit 24a and 24b making it possible in particular, as is conventional, to optimize the transfer of electrical energy between each primary coil and the secondary coil 32. The primary module 20 also comprises an electronic control circuit 25 that may comprise, as is conventional, one or more microcontrollers, and/or programmable logic circuits (of FPGA, PLD, etc. type) and/or specialized integrated circuits (ASIC), and/or a set of discrete electronic components, and a set of means, considered to be known to those skilled in the art for performing signal processing (analog filter, amplifier, analog-to-digital converter, sampler, etc.). As will be described later on with reference to FIGS. 5A-5C, the control circuit 25 uses, as input parameters, the voltage or current variations in the primary coils 22a and 22b to estimate the position of said secondary module 30 in relation to the primary module 20 and to decode signals containing information transmitted by the secondary module 30. It is also able to drive the motor M responsible for deploying the door handle. The motor M is controlled on the basis of the estimated position of the secondary module 30 in relation to the primary module 20. The control circuit 25 may also modulate the amplitude of the voltage applied across the terminals of the primary coils 22a and 22b so as to encode signals containing information to be transmitted to the secondary module 30. The impedance-matching and decoupling circuits 24a and 24b may possibly be integrated into the control circuit 25.

The secondary module 30 comprises, in the example shown, several electronic circuits. One of these electronic circuits, called "secondary circuit" 31, comprises a secondary coil 32. The secondary module 30 is able to move in relation to the primary module 20 along a predetermined path, which is such that the secondary coil 32 moves from a position in which it is primarily facing a first primary coil 22a to a position in which it is primarily facing a second primary coil 22b, or vice versa. The secondary coil 32 is then the recipient of currents induced by the magnetic fields generated by the flow of an AC electric current in the primary coils 22a and 22b, and the amplitude of the magnetic field flux generated by a primary coil through the secondary coil is at a maximum when the secondary coil is primarily facing said primary coil. The secondary module 30 also comprises an electronic control circuit 34 that may comprise, as is conventional, one or more microcontrollers, and/or programmable logic circuits (of FPGA, PLD, etc. type), and/or specialized integrated circuits (ASIC), and/or a set of discrete electronic components, and one or more sensors for detecting for example the approach of the hand or of a fob of a user, which may ultimately then trigger the deployment of the handle, the locking or the unlocking of the door. The control circuit 34 may also be configured so as to decode signals containing information transmitted by the primary module 20. Such signals are received via a reception circuit 35. The control circuit 34 may also be configured so as to encode signals containing information to be transmitted to the primary module 20. Such signals are transmitted via a transmission circuit 36. The reception circuit 35 and the transmission circuit 36 for this purpose include a set of means considered to be known to those skilled in the art (analog filter, amplifier, analog-to-digital converter, etc.). A remote power supply circuit 37 makes it possible to recover the electrical energy transmitted through magnetic induction between the primary coils 22a and 22b and the secondary coil 32 in order to supply electric power to the secondary module 30. It may for example include a rectifier (AC-to-DC converter) for supplying power to the control circuit 34, the reception circuit 35 and the transmission circuit 36 with a DC voltage or current from the AC voltage or current induced in the secondary coil.

The design of the electronic matching and decoupling circuits 24a and 24b, control circuits 25 and 34, reception circuit 35, transmission circuit 36 and remote power supply circuit 37 are considered to be known to those skilled in the art, and only the embodiments of the primary circuit 21 and secondary circuit 31 will be described in the remainder of the description.

Figure 2:
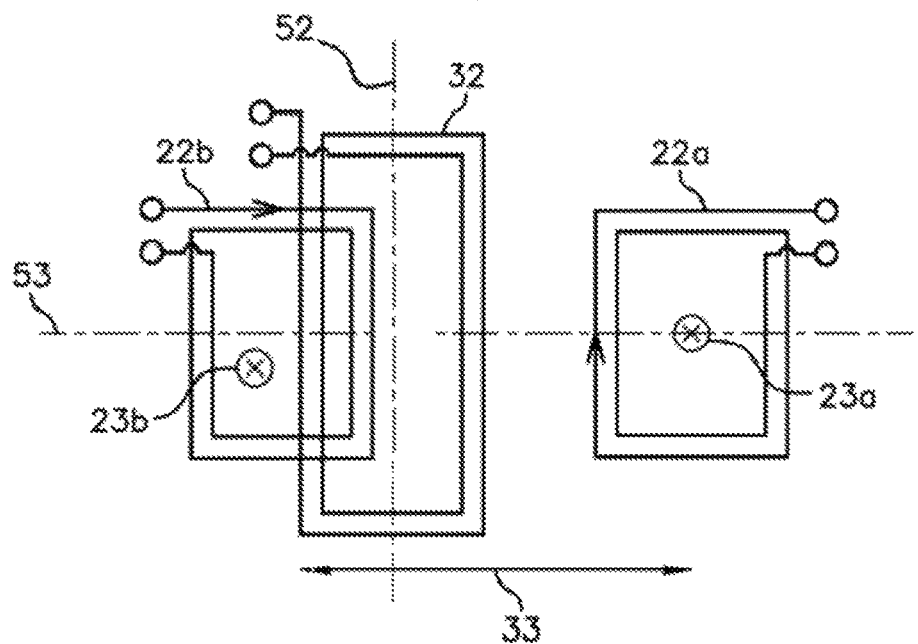
FIG. 2 shows a schematic depiction of one preferred embodiment for the arrangement of two primary coils and of a secondary coil.

FIG. 2 schematically shows one preferred embodiment with regard to the arrangement of the two primary coils 22a and 22b of the primary circuit 21 and of the secondary coil 32 of the secondary circuit 31.

In this preferred embodiment, the primary coils 22a and 22b have respective parallel axes and have identical rectangle shapes in a plane orthogonal to said axes. Each primary coil is for example positioned at one end of the primary circuit along a longitudinal axis 53.

The axis of the secondary coil 32 is parallel to the axes of the primary coils 22a and 22b. The secondary coil has the shape of a rectangle in an orthogonal plane formed by the axis of said secondary coil. Advantageously, the longitudinal axis 52 of the rectangle formed by the secondary coil is perpendicular to the longitudinal axis 53 of the primary circuit 21, and the surface area of the rectangle formed by the secondary coil 32 at least entirely covers the surface area formed by a primary coil 22a, 22b when the secondary coil 32 is facing said primary coil, so as to optimize the inductive coupling existing between a primary coil 22a, 22b and the secondary coil 32 when the secondary coil is facing said primary coil.

The primary coils 22a, 22b and the secondary coil 32 may include one or more substantially superimposed turns. They may be formed for example of tracks traced on printed circuit boards on which the primary circuit 21 and the secondary circuit 31 are respectively integrated. The printed circuits respectively containing the primary circuit 21 and the secondary circuit 31 are then placed in two parallel planes separated by a short distance, for example a few millimeters, or even a few centimeters at most, so as to ensure optimum inductive coupling between the primary coils and the secondary coil 32.

According to other embodiments, the primary coils 22a, 22b and the secondary coil 32 may consist of the winding of several turns that are then superimposed about their respective axis.

In preferred embodiments, the primary coils include the same number of turns, which may be equal to one.

When the secondary module 30 moves, the path 33 of the secondary circuit 31 in relation to the primary circuit 21 is a linear translational movement along the longitudinal axis 53 of the primary circuit 21. This movement is such that the secondary coil 32 moves from a position in which it is primarily facing a first primary coil 22a to a position in which it is primarily facing a second primary coil 22b, or vice versa.

The amplitude of the magnetic field flux 23a or 23b generated by a primary coil 22a, 22b through the secondary coil 32 is at a maximum when the secondary coil is primarily facing said primary coil. The amplitude of the magnetic field flux generated by the other primary coil through the secondary coil is then at a minimum. The advantages that result from this will be described hereinafter in the description of FIGS. 5A-5C.

It should be noted that other shapes and other arrangements of the primary coils and of the secondary coil may be contemplated, and these are merely variants of aspects of the invention. For example, the primary coils 22a, 22b and/or the secondary coil 32 could have turns of circular shape. In another example, the primary coils could be side-by-side, such that the secondary coil always remains facing all or part of at least one of the primary coils during movement thereof.

It should also be noted that other types of movement of the secondary coil in relation to the primary coils may be contemplated, such as for example a movement along a curve.

In the remainder of the description, unless explicitly stated otherwise, the scenario will be taken of the preferred embodiment described by FIG. 2 with regard to the arrangement of the primary coils 22a and 22b and of the secondary coil 32.

FIGS. 3A-3D highlight several schematic depictions of the primary module and of the secondary module depending on whether the door handle is in the retracted or deployed position.

Figure 6:
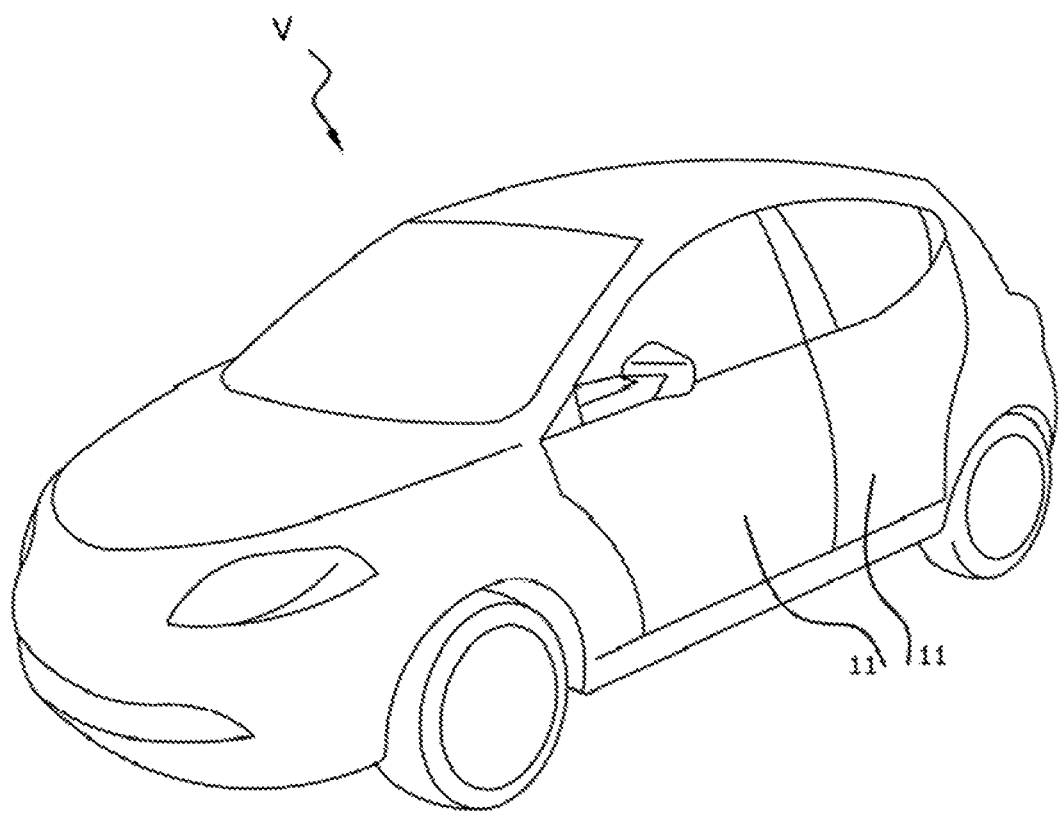
FIG. 6 shows an exemplary vehicle including a door with a deployable handle according to any one of the embodiments of the invention.

FIG. 3A schematically shows, in a sectional view, a primary module 20 positioned in a door 11 of a motor vehicle V (see FIG. 6). It is possible to see here in particular the primary coils 22a and 22b of the primary circuit 21, facing which the secondary coil 32 moves with a linear translational movement.

FIG. 3B schematically shows, in the same sectional view, a secondary module 30 integrated into the deployable door handle 12. It is possible to see here in particular the secondary coil 32. In this figure, the handle is in the deployed position.

FIG. 3C schematically shows, in the same sectional view, the complete device 10 comprising the primary module 20 and the secondary module 30. In this figure, the handle is in the deployed position. In other words, the secondary coil 32 is at the end of travel, facing one of the ends of the primary circuit 21, that is to say that it is mainly facing the first primary coil 22a.

In FIG. 3D, the handle is in the retracted position. In other words, the secondary coil 32 is at the end of travel, facing the other end of the primary circuit 21, that is to say that it is mainly facing the second primary coil 22b.

Figure 4:
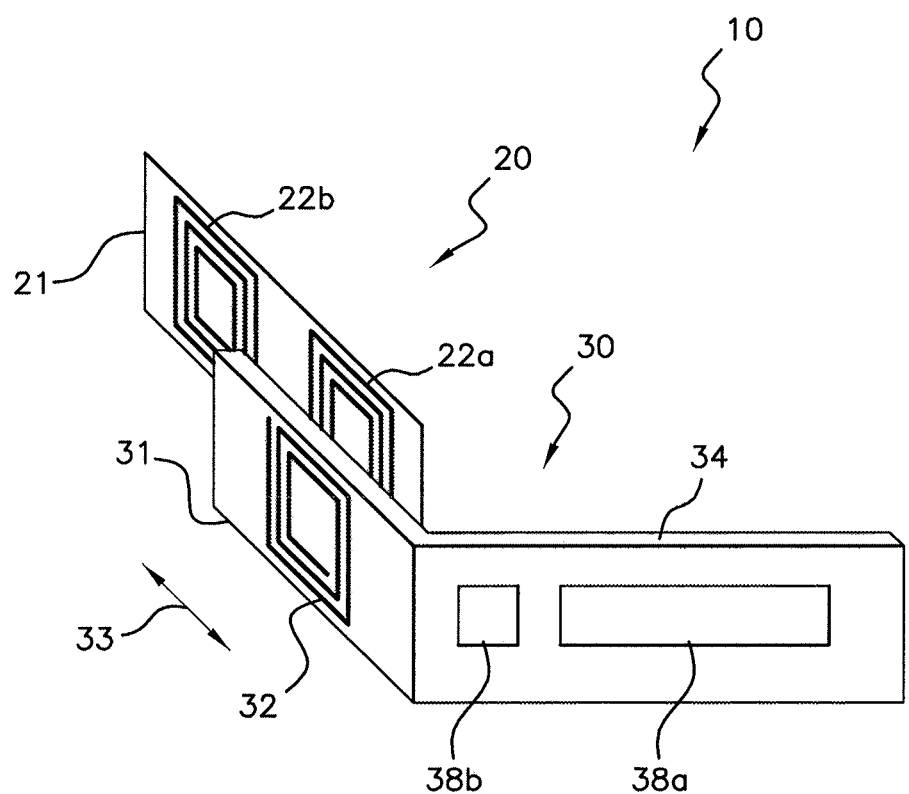
FIG. 4 shows a schematic depiction of one embodiment of the device for forming a door module and a door handle module.

FIG. 4 schematically shows one embodiment of the device 10 comprising a primary module 20 and a secondary module 30. Besides the primary circuit 21 comprising the two primary coils 22a and 22b and the secondary circuit 31 comprising the secondary coil 32 whose path 33 is a linear translational movement in relation to the primary circuit 21, FIG. 4 shows a control circuit 34 comprising two capacitive sensors 38a and 38b. These capacitive sensors are placed on the face of the handle that is flush with the body of the door when the handle is in the retracted position. The sensors may thus for example detect the presence of the hand or of a fob of a user. For example, the sensor 38a may serve to deploy the handle if the hand of a user is detected, and the sensor 38b may serve to lock and unlock the door.

The control circuit 34 may possibly also intervene to authenticate a user, for example by exchanging authentication information through radio communication with a fob of the user.

Figure 5:
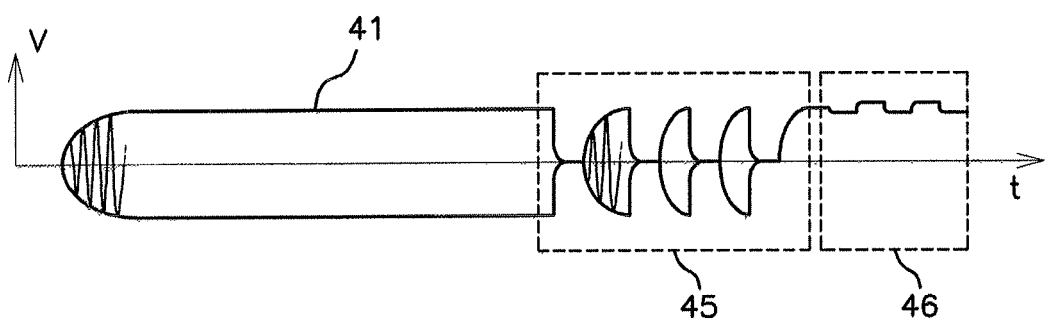
FIGS. 5A-5C show graphs depicting the evolution over time of the amplitude of the voltage across the terminals of the primary coils, of the amplitudes of the strengths of the load currents in the primary coils, and of the amplitude of the voltage across the terminals of the secondary coil.
Figure 5:
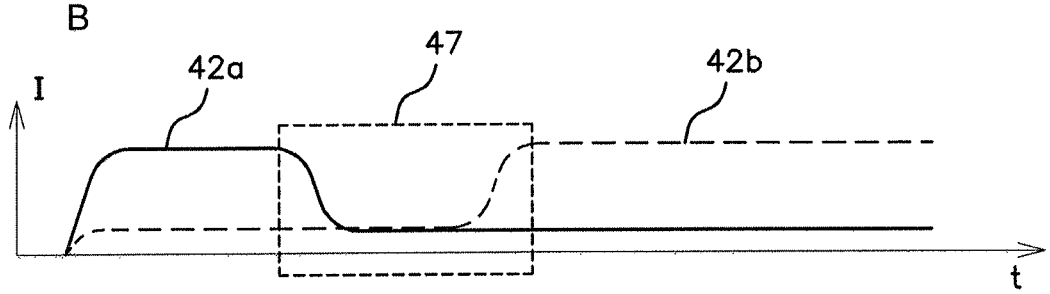
Figure 5:
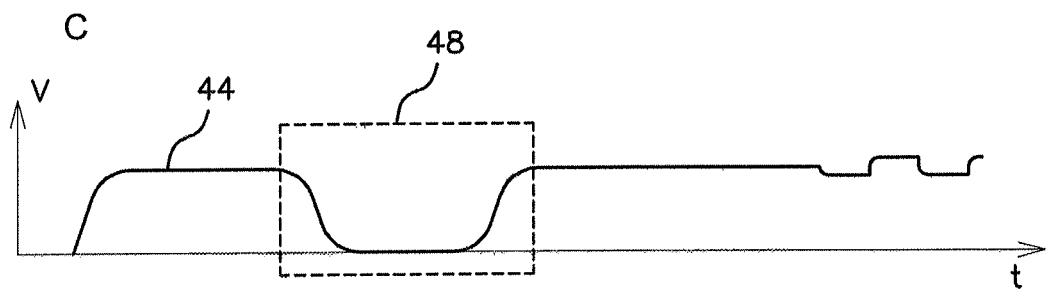

FIGS. 5A-5C contain several graphs showing the evolution over time of the amplitude of the voltage across the terminals of the primary coils, of the amplitudes of the strengths of the load currents in the primary coils, and of the amplitude of the voltage across the terminals of the secondary coil.

FIG. 5A shows the evolution over time of the voltage across the terminals of a primary coil 22a or 22b. The curve 41 in particular shows the envelope of the amplitude of the AC voltage applied by the primary module 20 across the terminals of the primary coil under consideration.

The amplitude of the voltage across the terminals of the primary coils is generally constant. It may however be modulated, as shown in part 45 of the graph, so as to create a signal transporting information to be transmitted to the secondary module 30. The control circuit 25 is configured for example so as to generate such a signal.

Therefore, the amplitude of the voltage observed across the terminals of a primary coil may be modulated, as shown in part 46 of the graph, by a signal transporting information transmitted by the secondary module 30 to the primary module 20. Such a signal is generated for example by the secondary module 30 in order to transmit information from the control circuit 34 by modulating the amplitude of a voltage applied across the terminals of the secondary coil 32 by the transmission circuit 36. The electric current flowing through the secondary coil will thus generate an electromagnetic field that will induce the variations in the amplitude of the voltage across the terminals of the primary coils observed in part 46 of the graph. It should be noted that the modulation of the voltage across the terminals of a primary coil such as shown in part 46 of the graph may possibly be observed on just one primary coil, in particular if the secondary coil is facing only this primary coil at the time when the signal is transmitted by the secondary module.

Advantageously, the average duration of the periods of information transmission between the primary module 20 and the secondary module 30, such as that shown in part 45 of the graph of FIG. 5A, is short in comparison with the average duration of the periods during which the amplitude of the voltage applied across the terminals of the primary coils is close to its maximum. For example, the ratio between these two average durations is less than 5%. Thus, the communication of information between the primary module 20 and the secondary module 30 has only a small impact on the efficiency of the inductive transfer of energy to the secondary module 30 by the primary module 20. It may also be contemplated to use relatively high modulation levels, for example of the order of 75% or more, for the modulation of the voltage across the terminals of the primary coils, such that the average amplitude of the voltage across the terminals of the primary coils during a modulation period, such as that shown by part 45 of the graph, remains relatively high in order to minimize the impact on the inductive transfer of energy to the secondary module 30 by the primary module 20.

It is important to note that, in conventional remote power supply devices, it is known to exchange information in relation to the load (level of charge, charging speed, billing of the supplied energy, etc.) by using coils that are used to transmit electrical energy through magnetic induction. In our example, this furthermore involves transmitting information that is not necessarily linked to the remote power supply function, such as for example information from sensors that detect the presence of the hand or of a fob of a user.

Radio communication through amplitude modulation of a signal is known to those skilled in the art and will therefore not be described in more detail in the present application.

It should be noted that the amplitude modulation used in the embodiment described here is merely a nonlimiting example for encoding signals transporting information between the primary module 20 and the secondary module 30. Therefore, other types of modulation could be used, such as for example frequency modulation or phase modulation, and these would merely represent variants of aspects of the present invention.

FIG. 5B shows the evolution over time of the amplitudes of the strengths of the load currents 42a and 42b measured respectively in the primary coils 22a and 22b.

In particular, part 47 of the graph corresponds to a movement of the door handle from the deployed position to the retracted position.

The strength of the load current 42a in the first primary coil 22a varies in correlation with the surface area of the first primary coil 22a facing the secondary coil 32. Specifically, the greater this surface area, the greater the amplitude of the magnetic field flux generated by the first primary coil 22a through the secondary coil 32, in other words, the stronger the inductive coupling between the first primary coil 22a and the secondary coil 32, the greater the amplitude of the strength of the load current 42a will be as a result.

In the light of the arrangement of the coils as described above with reference to FIGS. 2 and 3A-3D, the amplitude of the strength of the load current 42a is therefore at a maximum when the secondary coil is at the end of travel at the end of the primary circuit 21 for which the surface area of the first primary coil 22a that is facing the secondary coil 32 is at a maximum. In this position, the door handle is deployed. In this position, the amplitude of the strength of the load current 42b flowing in the second primary coil 22b is at a minimum because the inductive coupling between the second primary coil 22b and the secondary coil 32 is also at a minimum.

When the secondary coil moves toward the other end of the primary circuit 21, that is to say when the door handle retracts, the surface area of the first primary coil 22a facing the secondary coil 32 gradually decreases, and the same applies for the amplitude of the strength of the load current 42a in the first primary coil 22a. The amplitude of the strength of the load current 42a in the first primary coil 22a reaches a minimum value when the secondary coil is no longer facing said first primary coil 22a.

When the door handle approaches its retracted position, the surface area of the second primary coil 22b facing the secondary coil 32 gradually increases, and the same applies for the amplitude of the strength of the load current 42b in the second primary coil 22b. The amplitude of the strength of the load current 42b in the second primary coil 22b reaches a maximum value when the handle has reached the retracted position, the secondary coil 32 then being at the end of travel at the other end of the primary circuit.

Thus, a maximum value of the amplitude of the strength of the load current in one and only one of the primary coils 22a and 22b corresponds to each deployed or retracted position of the secondary coil 32 in relation to the primary circuit 21. It is thus possible to determine whether the handle is in the deployed or retracted position on the basis of the value of the amplitude of the strength of the two load currents 42a and 42b. Therefore, it is possible to detect that the handle is approaching a deployed or retracted stop position when the amplitude of the strength of the load current in one or the other of the primary coils begins to increase.

It should be noted in the example described here that it is considered that the primary coils 22a and 22b are fixed in relation to the primary circuit 21, that the primary circuit 21 is fixed in relation to the primary module 20, that the secondary coil 32 is fixed in relation to the secondary circuit 31, and that the secondary circuit 31 is fixed in relation to the secondary module 30. Thus, estimating the position of the secondary coil in relation to the primary coils is equivalent to estimating the position of the secondary circuit in relation to the primary circuit, or to estimating the position of the secondary module in relation to the primary module.

Estimating the position of the secondary module 30 in relation to the primary module 20 then makes it possible to control the motor M responsible for deploying the door handle. When, during its movement, the secondary coil 32 is facing neither the first primary coil 22a nor the second primary coil 22b, then it is not possible to precisely determine the position of the secondary module, but this information is not strictly necessary to control the motor (this corresponds to zone 47 of FIG. 5B).

It should also be noted that other parameters representative of the amplitude of the magnetic field flux generated by each primary coil through the secondary coil could be used. Thus, instead of measuring the amplitudes of the strengths of the load currents for the primary coils, it would be possible for example to measure the amplitudes of the load voltages in the primary coils if it is considered that they are supplied by an AC current source (and not by an AC voltage source).

FIG. 5C shows the evolution over time of the amplitude 44 of the voltage across the terminals of the secondary coil 32. This voltage is induced by the magnetic fields 23a and 23b generated respectively by the primary coils 22a and 22b and passing through the secondary coil 32. As explained above, when the handle is in the deployed position, the first primary coil 22a is facing the secondary coil 32, and the amplitude of the magnetic field flux generated by the first primary coil 22a through the secondary coil 32 is at a maximum. By contrast, when the handle is in the retracted position, the second primary coil 22b is facing the secondary coil 32, and the amplitude of the magnetic field flux generated by the second primary coil 22b through the secondary coil 32 is at a maximum.

The amplitude 44 of the voltage induced by the primary coils in the secondary coil is therefore at a maximum at each of the deployed and retracted positions, and it decreases gradually when the secondary coil moves away from one or the other of these two positions so as to adopt a virtually zero value when it is not facing either of the two primary coils (this corresponds to zone 48 of FIG. 5C).

The transmission of energy through inductive coupling from the primary module 20 to the secondary module 30 therefore takes place efficiently when the door handle is either in the retracted position or in the deployed position. As the deployment time of the handle is short (of the order of a second), and as the functions of the control circuit 34 are not necessary during the deployment of the handle, the fact that the remote supply of power for the primary module 20 is not optimum, or even not functional when the door handle is moving, has only a limited or even negligible impact.

An aspect of the invention thus overcomes the drawbacks from the prior art by proposing a remote power supply device 10 for a door 11, with a deployable handle, of a motor vehicle V in which a secondary module 30 is able to move in relation to a primary module 20, and that is able to be used to perform other functions, such as for example estimating the position of the secondary module or for wireless communication between the two modules.

Figure 3:
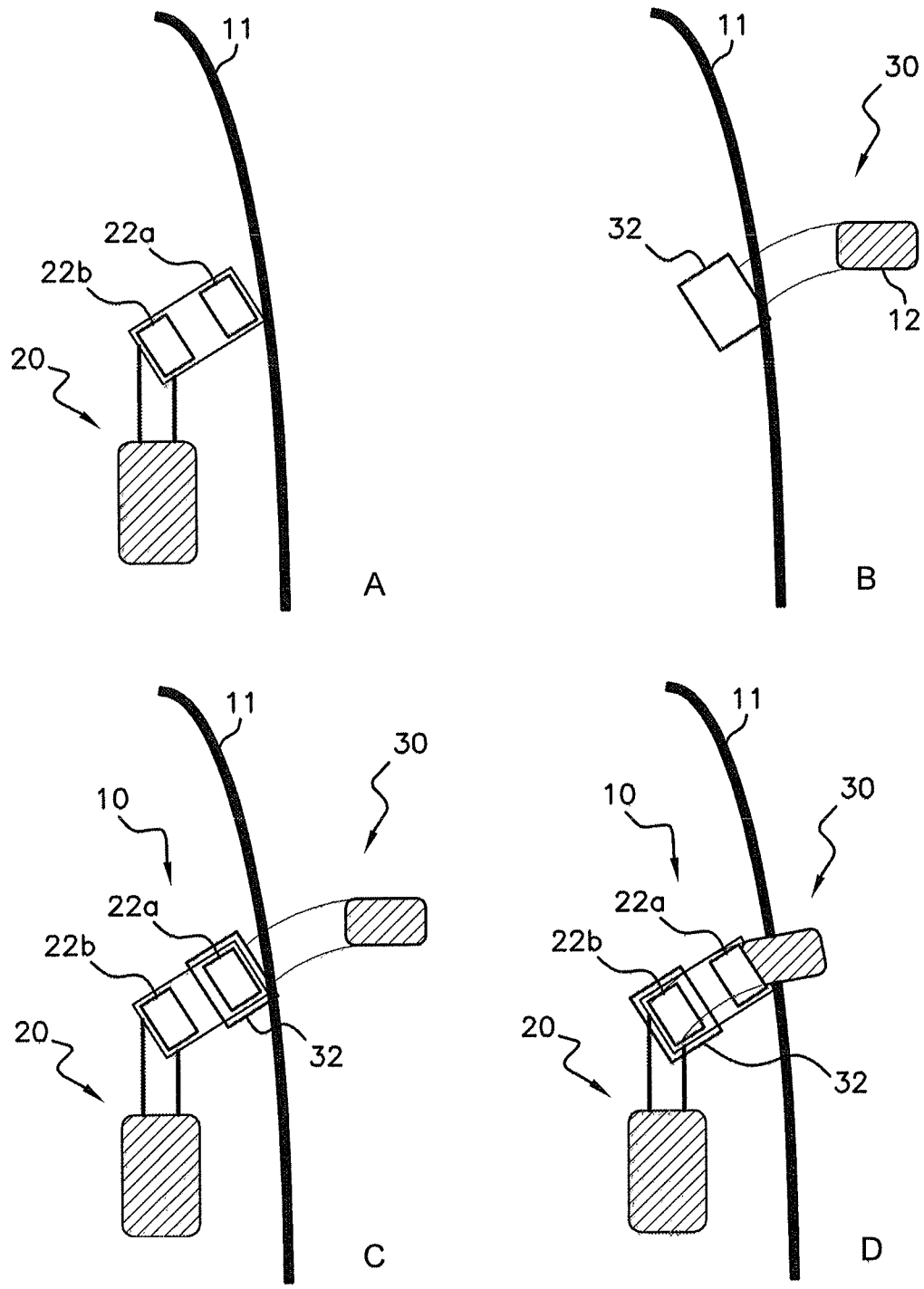
FIGS. 3A-3D show several schematic depictions of the primary module and of the secondary module depending on whether the door handle is in the retracted or deployed position.

An aspect of the invention is however not limited to the exemplary embodiments that are described and shown. In particular, the shape and the arrangement of the primary coils and of the secondary coil as shown in FIGS. 2 to 4 should not be interpreted as limiting. The same applies for the movement of the secondary circuit in relation to the primary circuit, which is not necessarily limited to a translational movement.

It should also be noted that, although the embodiments described above relate to a motor vehicle door, aspects of the invention may very well apply to other opening elements in general.

More generally, although an aspect of the invention is particularly well-suited to producing a system for a deployable door handle, it may also be contemplated to use it for other applications in which it is desirable to remotely supply power to a secondary module that moves in relation to a primary module and whose position it is desired to estimate.

The invention claimed is:

1. An electric power supply device for a handle able to be deployed in relation to a motor vehicle door, including a primary module integrated into the door and a secondary module integrated into the handle, the secondary module moving in relation to the primary module along a predetermined path when the handle moves between a deployed position and a retracted position in relation to the door, wherein said primary module is configured so as to form an electromagnetic field able to supply electric power to said secondary module through magnetic induction, said primary module includes at least two primary coils and said secondary module includes a secondary coil, said primary coils and said secondary coil being arranged such that:
   when the handle moves from the deployed position to the retracted position, the secondary coil moves from a first primary coil to a second primary coil,
   an amplitude of a magnetic field flux generated by the first primary coil through the secondary coil is at a maximum when the handle is in the deployed position,
   an amplitude of a magnetic field flux generated by the second primary coil through the secondary coil is at a maximum when the handle is in the retracted position.

2. The device as claimed in claim 1, wherein the primary module includes a control circuit configured so as to measure, for each primary coil, a parameter representative of the amplitude of the magnetic field flux generated by the primary coil under consideration through the secondary coil, and so as to estimate a position of the secondary module on the path on the basis of said measurements.

3. The device as claimed in claim 2, wherein a parameter representative of the amplitude of the magnetic field flux generated by the primary coil through the secondary coil is an amplitude of a strength of a load current flowing in said primary coil.

4. The device as claimed in claim 2, wherein the control circuit of the primary module is furthermore configured so as to control, on the basis of the estimated position of the secondary module, a motor that moves said secondary module in relation to the primary module.

5. The device as claimed in claim 2, wherein the control circuit of the primary module is furthermore configured so as to modulate an amplitude of a voltage across the terminals of the primary coils on the basis of an item of information to be transmitted to the secondary module.

6. The device as claimed in claim 1, wherein the secondary module furthermore includes a transmission circuit configured so as to modulate an amplitude of a voltage across the terminals of the secondary coil on the basis of an item of information to be transmitted to the primary module.

7. The device as claimed in claim 1, wherein the secondary module includes a remote power supply circuit configured so as to recover an electrical energy transmitted through magnetic induction between at least one of the primary coils and the secondary coil so as to supply the secondary module with a DC-voltage electric power supply when the handle is in the retracted or deployed position.

8. The device as claimed in claim 1, wherein the path followed by the secondary module corresponds to a translational movement of said secondary module in relation to the primary module.

9. A vehicle door with a deployable handle, comprising an electric power supply device as claimed in claim 1.

10. A motor vehicle, comprising a door with a deployable handle as claimed in claim 9.

11. The device as claimed in claim 3, wherein the control circuit of the primary module is furthermore configured so as to control, on the basis of the estimated position of the secondary module, a motor that moves said secondary module in relation to the primary module.

12. The device as claimed in claim 3, wherein the control circuit of the primary module is furthermore configured so as to modulate an amplitude of a voltage across the terminals of the primary coils on the basis of an item of information to be transmitted to the secondary module.

13. The device as claimed in claim 4, wherein the control circuit of the primary module is furthermore configured so as to modulate an amplitude of a voltage across the terminals of the primary coils on the basis of an item of information to be transmitted to the secondary module.

* * * * *